(12) United States Patent
Miyauchi et al.

(10) Patent No.: US 12,069,954 B2
(45) Date of Patent: Aug. 20, 2024

(54) POWER GENERATING ELEMENT AND APPARATUS INCLUDING POWER GENERATING ELEMENT

(71) Applicant: CANON KABUSHIKI KAISHA, Tokyo (JP)

(72) Inventors: Yuichiro Miyauchi, Kanagawa (JP); Masakazu Mori, Kanagawa (JP); Noriyuki Chino, Kanagawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 336 days.

(21) Appl. No.: 17/535,338

(22) Filed: Nov. 24, 2021

(65) Prior Publication Data

US 2022/0085272 A1 Mar. 17, 2022

Related U.S. Application Data

(63) Continuation of application No. PCT/JP2020/020546, filed on May 25, 2020.

(30) Foreign Application Priority Data

May 31, 2019 (JP) .................. 2019-103230

(51) Int. Cl.
*H10N 35/01* (2023.01)
*H02N 2/18* (2006.01)
*H10N 35/00* (2023.01)

(52) U.S. Cl.
CPC ........... *H10N 35/101* (2023.02); *H02N 2/186* (2013.01)

(58) Field of Classification Search
CPC ...... H10N 35/101; H10N 35/80; H10N 35/85; H10N 30/80; H10N 30/85; H02N 2/186;
(Continued)

(56) References Cited

U.S. PATENT DOCUMENTS

| 2013/0140919 A1* | 6/2013 | Ueno | ............... H10N 35/101 |
| | | | 310/26 |
| 2014/0346902 A1* | 11/2014 | Ueno | ............... H10N 35/101 |
| | | | 310/26 |

(Continued)

FOREIGN PATENT DOCUMENTS

| JP | 4905820 B2 | 3/2012 |
| JP | 2015029377 A | 2/2015 |

(Continued)

*Primary Examiner* — Michael Andrews
(74) *Attorney, Agent, or Firm* — CANON U.S.A., INC. IP Division

(57) ABSTRACT

A power generating element according to an aspect of the present disclosure includes at least one magnetostrictive portion containing a magnetostrictive material, at least one magnetic portion containing a magnetic material, part of a surface of the magnetic portion being fixed to the magnetostrictive portion, a coil housing part of one of the magnetostrictive portion and the magnetic portion, and a magnet portion including a magnet and fixed to the magnetostrictive portion, wherein the magnetic portion is magnetically connected in parallel to the magnetostrictive portion and is fixed to the magnetostrictive portion so as to have an interval between the magnetostrictive portion and the magnetic portion, the interval being magnetically connected in series to the magnetic portion.

17 Claims, 14 Drawing Sheets

(58) Field of Classification Search
CPC .......... H02N 2/188; H02N 2/18; H02N 2/001; H02N 2/0015
USPC .......................................................... 310/26
See application file for complete search history.

(56) References Cited

U.S. PATENT DOCUMENTS

| | | | | |
|---|---|---|---|---|
| 2015/0155472 | A1* | 6/2015 | Furukawa | H10N 35/101 |
| | | | | 310/26 |
| 2015/0288300 | A1* | 10/2015 | Hasegawa | H02N 2/188 |
| | | | | 310/26 |
| 2019/0131892 | A1* | 5/2019 | Ueno | H10N 35/101 |

FOREIGN PATENT DOCUMENTS

| | | |
|---|---|---|
| JP | 6343852 B2 | 6/2018 |
| WO | 2014119202 A1 | 8/2014 |

* cited by examiner

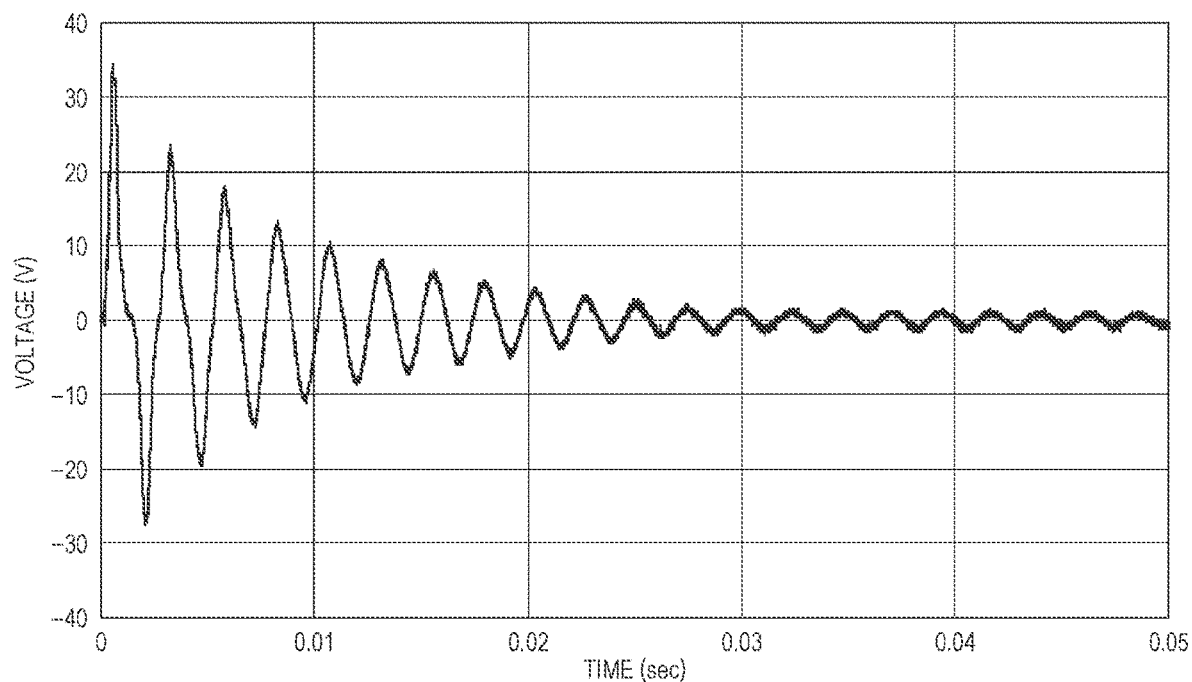

POWER GENERATING ELEMENT AND APPARATUS INCLUDING POWER GENERATING ELEMENT

CROSS-REFERENCE TO RELATED APPLICATIONS

This application is a Continuation of International Patent Application No. PCT/JP2020/020546, filed May 25, 2020, which claims the benefit of Japanese Patent Application No. 2019-103230, filed May 31, 2019, both of which are hereby incorporated by reference herein in their entirety.

TECHNICAL FIELD

The present disclosure relates to power generating elements and apparatuses including the power generating elements.

BACKGROUND ART

"Energy harvesting" techniques for obtaining electric power from unused energy existing in the environment have recently been attracting attention as energy saving techniques. In particular, vibration power generation, which obtains power from vibration, generates higher density energy than thermoelectric generation, which obtains power from heat, and therefore its application to power supply for constant communication Internet of Things (IoT) and charging of mobile phones has been proposed. For example, a movable-magnet power generation method that vibrates a magnet using environmental vibrations to cause a coil to generate an induced electromotive force is used in various applications. Another power generation has recently been proposed which uses an inverse magnetostrictive phenomenon (hereinafter referred to as inverse magnetostrictive generation) in which magnetic flux density is changed by a change in force, not by the vibration of a magnet.

PTL 1 describes a bimorph structure in which two magnetostrictive rods are arranged in parallel as a configuration of the inverse magnetostrictive power generating element. The two magnetostrictive rods are magnetically connected in parallel and receive opposite stresses. For this reason, if the magnetoresistance of one magnetostrictive rod is high, the magnetoresistance of the other magnetostrictive rod is low.

PTL 2 discloses an inverse magnetostrictive power generating element including a closed magnetic circuit in which a magnetostrictive material is connected in series to each magnetoresistance, the closed magnetic circuit having a interval magnetically connected in series to the closed magnetic circuit.

However, the inverse magnetostrictive power generating element based on the configuration of the magnetic circuit has a problem in that it cannot always generate a large amount of electric power in actual use.

CITATION LIST

Patent Literature

PTL 1 Japanese Patent No. 4905820
PTL 2 Japanese Patent No. 6343852

SUMMARY OF INVENTION

The present disclosure provides a power generating element that increases the amount of power generation as compared with conventional power generation using generated using the inverse magnetostrictive phenomenon, as well as an apparatus including the power generating element. The disclosure also provides operational advantages given by the configurations of the embodiments, which cannot be given by the related art.

A power generating element according to an aspect of the present disclosure includes at least one magnetostrictive portion containing a magnetostrictive material, at least one magnetic portion containing a magnetic material, part of a surface of the magnetic portion being fixed to the magnetostrictive portion, a coil housing part of one of the magnetostrictive portion and the magnetic portion, and a magnet portion including a magnet and fixed to the magnetostrictive portion, wherein the magnetic portion is magnetically connected in parallel to the magnetostrictive portion and is fixed to the magnetostrictive portion so as to have an interval between the magnetostrictive portion and the magnetic portion, the interval being magnetically connected in series to the magnetic portion.

Further features of the present invention will become apparent from the following description of exemplary embodiments with reference to the attached drawings.

BRIEF DESCRIPTION OF DRAWINGS

FIG. 8 is a graph illustrating an example of the temporal change in electromotive force of the power generating element of Example 2.

DESCRIPTION OF EMBODIMENTS

Embodiments of the present disclosure will be described in detail hereinbelow with reference to the accompanying drawings. It is to be understood that the disclosure of this specification is not limited to the following embodiments and can be variously modified based on the spirit of the disclosure (including organic combinations of the embodiments) and that the modifications are not excluded from the scope of the disclosure. In other words, all of the combinations of the embodiments and modifications are included in the embodiments of the disclosure.

First Embodiment

A power generating element according to a first embodiment generates electric power using an inverse magnetostrictive phenomenon in which magnetic flux density is changed by changing force, instead of vibrating a magnet. The power generating element according to this embodiment is configured to generate more electrical power than an existing power generating element using the inverse magnetostrictive phenomenon by appropriately arranging a holding plate, a magnetostrictive material, a magnetic material, a coil, and a magnet.

Configuration of Power Generating Element

Figure 1A:
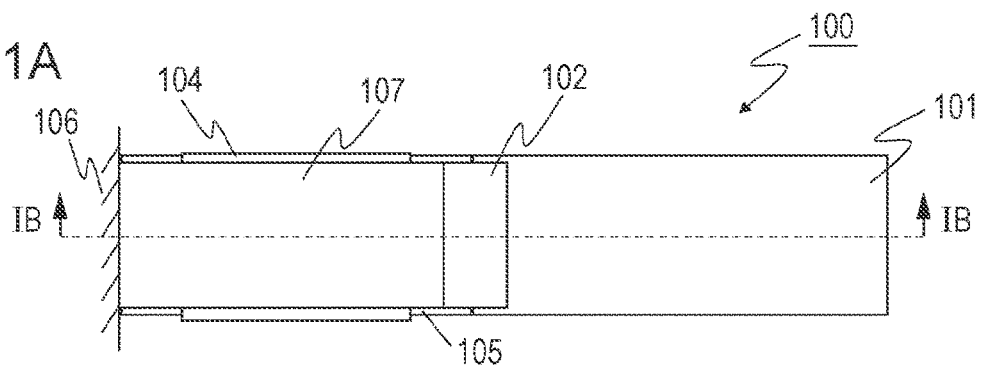
FIG. 1A is a schematic diagram illustrating an example of the configuration of a power generating element according to a first embodiment.
Figure 1B:
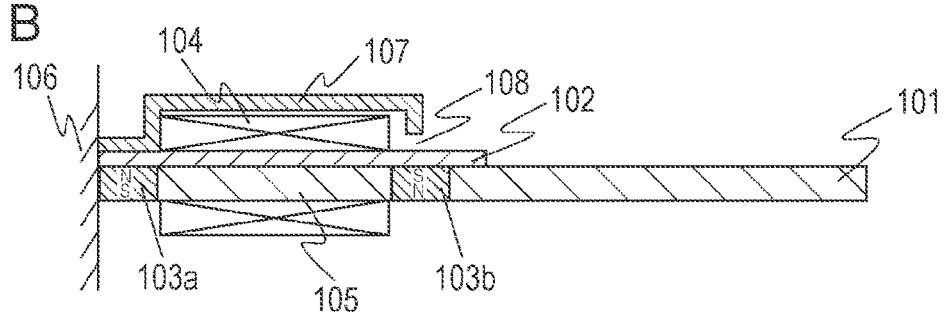
FIG. 1B is a schematic cross-sectional view of the power generating element according to the first embodiment illustrating an example of the configuration thereof.

The configuration of the power generating element 100 of this embodiment will be described with reference to FIGS. 1A to 1C. FIG. 1A is a schematic top view of the power generating element 100 of this embodiment illustrating the configuration thereof. FIG. 1B is a schematic cross-sectional view of the power generating element 100 of this embodiment taken along IB-IB in FIG. 1A illustrating the configuration thereof.

The power generating element 100 of this embodiment is held by a holder 106 and includes a holding plate 101, a magnetostrictive portion 102, a magnet portion including a magnet 103a and a magnet 103b, a coil 104, a nonmagnetic area 105, a magnetic portion 107, and an interval 108. The term "fix" of a member and another member may be fix in contact or fix with a different material disposed therebetween. In other words, two members need only be physically fixed.

The holding plate 101 is fixed to the magnetostrictive portion 102 at one end. The holding plate 101 is vibrated by an external force, such as a compressive stress or a tensile stress. The holding plate 101 may be firmly fixed to the magnetostrictive portion 102 by any connecting method, for example, laser welding, adhesive joining, solder joining, ultrasonic bonding, or bolt-nut joining. The holding plate 101 may be made of a ductile material because it continuously receives a compressive stress or a tensile stress. The material for the holding plate 101 is selected depending on the configuration of the magnetic circuit with respect to the magnetostrictive portion 102. For this reason, the holding plate 101, if used to constitute a magnetic circuit, is made of a magnetic material, such as a carbon steel, a ferritic stainless steel (for example, SUS430), or a martensitic stainless steel (for example, SUS420J2). In contrast, if the holding plate 101 is not used for the magnetic circuit, a nonmagnetic material such as an austenite-based stainless steel (for example, SUS304, SUS303, and SUS316) is used.

The holding plate 101 receives a force so as to vibrate in the vertical direction in FIG. 1B. For this reason, the holding plate 101 may be made of an elastic material, such as a spring material, to reduce the mechanical attenuation of vibrations. The force that induces vertical vibrations in FIG. 1B can be generated by base excitation caused by the fact that the holder 106 is fixed to a vertically vibrating vibration source or by the operation of applying force to the end of the holding plate 101 opposite to the joint portion to flip the opposite end. The above method for applying force is given for mere illustrative purposes and any other methods for applying force to the magnetostrictive portion 102 may be employed. The above materials for the holding plate 101 are given for illustration and are not intended to limit the disclosure.

The magnetostrictive portion 102 contains a magnetostrictive material. The magnetostrictive portion 102 may contain a ductile magnetostrictive material because it continuously receives a compressive stress and a tensile stress. The magnetostrictive material may be a known magnetostrictive material, such as an iron-gallium alloy, an iron-cobalt alloy, an iron-aluminum alloy, an iron-gallium-aluminum alloy, or an iron-silicon-boron alloy, but they are given for mere illustrative purposes. The magnetostrictive portion 102 may have any suitable shape that enables connection to the holding plate 101 and may be rectangular parallelepiped or columnar in shape.

The magnet 103a and the magnet 103b are mounted to connect the magnetostrictive portion 102 and the magnetic portion 107 magnetically in parallel. The magnet 103a and the magnet 103b may be a neodymium magnet, a samarium cobalt magnet, or any other magnet.

The orientations of the magnetic poles of the magnet 103a and the magnet 103b may be opposite in the vertical direction, as shown in the schematic cross-sectional view of FIG. 1B. However, the orientations of the magnetic poles of the magnets 103a and 103b in the schematic cross-sectional view of FIG. 1B are given for mere illustrative purposes, and the N pole and the S pole of the magnet 103a and the magnet 103b may be opposite to those of FIG. 1B. In other words, the magnet 103a and the magnet 103b need only be fixed to the magnetostrictive portion 102 with different magnetic pole faces. The arrangement and the number of magnets are not limited to the above arrangement provided that the magnetostrictive portion 102 and the magnetic portion 107 are magnetically connected in parallel. For example, as shown in FIG. 1B, the magnet 103a and the magnet 103b may be fixed so that different magnetic pole faces are fixed to the surface of the magnetostrictive portion 102 remote from the magnetic portion 107. Alternatively, at least one of the magnet 103a and the magnet 103b may be fixed to the surface of the magnetostrictive portion 102 to which the magnetic portion 107 is fixed. Alternatively, only one or three or more magnets may be used.

The magnet portion may contain a magnetic material. In this case, at least one of the magnet 103a and the magnet 103b may be fixed to the magnetic material.

The coil 104 houses part of the magnetostrictive portion 102 and generates voltage according to the temporal change of the magnetic flux generated in the magnetostrictive portion 102 according to law of electromagnetic induction. The material of the coil 104 may be iron but may be any material.

The coil 104 in this embodiment is disposed to house part of the magnetostrictive portion 102 but may house the magnetic portion 107 to cause the magnetostrictive portion 102 to generate voltage. In other words, the coil 104 need only be disposed so as to house part of one of the magnetostrictive portion 102 and the magnetic portion 107. As shown in FIG. 1B, the coil 104 is disposed between the magnet 103a and the magnet 103b. The position where the coil 104 is disposed is not limited the above position. The coil 104 does not necessarily need to be disposed between two magnets.

The nonmagnetic area 105 is made of gas, a solid, or any other material. Examples include air, ductile nonmagnetic metal, and austenite stainless steels (SUS304, SUS303, and SUS316). The nonmagnetic area 105 may be integrated with the holding plate 101.

The magnetic portion 107 contains a magnetic material. The material for the magnetic portion 107 includes a carbon steel, a ferritic stainless steel (for example, SUS430), a martensitic stainless steel (for example, SUS420J2), and any other materials.

The magnetostrictive portion 102 and the magnetic portion 107 are joined together. The magnetostrictive portion 102 and the magnetic portion 107 may be firmly fixed by any connecting method, for example, laser welding, adhesive joining, solder joining, ultrasonic bonding, or bolt-nut joining. To magnetically connect the magnetic portion 107 in parallel to the magnetostrictive portion 102, at least part of the magnetic portion 107 is fixed to the magnetostrictive portion 102, as shown in FIG. 1B. In other words, the magnetic portion 107 is a member containing a magnetic material and fixed to the magnetostrictive portion 102 at part of the surface.

The magnetic portion 107 may be fixed so as to cover the coil 104 to increase the amount of change in the magnetic flux passing through the coil 104. For that reason, the magnetic portion 107 may partly have a U-like shape in cross section. In this case, the U-like shape in cross section of the magnetic portion 107 does not necessarily need to be symmetric and may be asymmetric to provide the interval 108, as shown in FIG. 1B. In other words, the magnetic portion 107 may be a member containing a magnetic material, partly having a U-like shape in cross section, and fixed to the magnetostrictive portion 102 at one end. The shape of the magnetic portion 107 is given for mere illustrative purposes and is not intended to limit the disclosure.

Figure 1C:
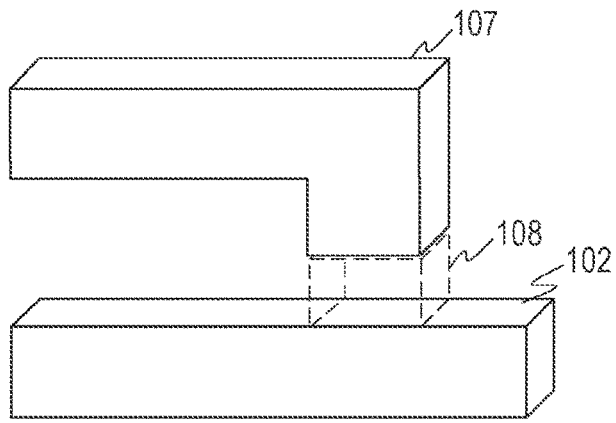
FIG. 1C is a schematic diagram illustrating an example of the configuration of the power generating element according to the first embodiment.

The interval 108 is a space having low magnetic resistance between the magnetostrictive portion 102 and the magnetic portion 107, as shown in FIG. 1C. In other words, the interval 108 is provided at an end different from the end at which the magnetostrictive portion 102 and the magnetic portion 107 are fixed. In the power generating element 100 according to this embodiment, the interval 108 is magnetically connected in series to the magnetic portion 107. The magnetic resistance of the interval 108 decreases when a compressive stress is applied to the magnetostrictive portion 102 and increases when a tensile stress is applied to the magnetostrictive portion 102.

It is known that the magnetic resistance of air is generally thousands of time higher than that of the magnetic portion 107 with the same shape. For this reason, if the interval 108 is too large, only the magnetostrictive portion 102 allows magnetic flux to pass therethrough regardless of the presence of stress, decreasing the temporal change of the magnetic flux. In contrast, to decrease the interval 108 in the configuration of FIG. 1D, the magnetic portion 107 may be disposed close to the magnetostrictive portion 102. However, disposing the magnetic portion 107 close to the magnetostrictive portion 102 will make it difficult to increase the number of turns of the coil 104.

Figure 1D:
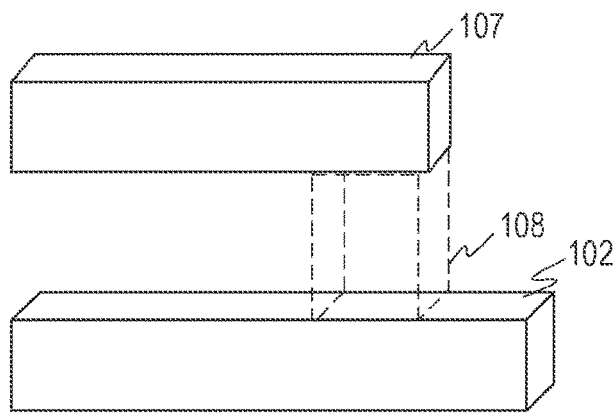
FIG. 1D is a schematic diagram illustrating an example of the configuration of the power generating element according to the first embodiment.

For that reason, the magnetic portion 107 may have the U-like shape in cross section shown in FIG. 1C, unlike the shape shown in FIG. 1D, in the viewpoint of increasing the number of turns of the coil 104 while reducing the size of the interval 108 and increasing the temporal change of the magnetic flux.

Although the power generating element 100 of this embodiment has the interval 108, rubber or another material may be used for the same role. Specifically, a material with a magnetic permeability of about 1, such as air or liquid, may be used. Another material whose magnetic resistance varies depending on the stress applied may be used. If rubber or another material is used instead of the interval 108, the magnetostrictive portion 102 and the magnetic portion 107 are mechanically connected. This configuration may increase the mechanical attenuation of the vibrations applied to the power generating element 100. For this reason, if the interval 108 is replaced with rubber or another material, the material may be a material that decreases the mechanical attenuation of the vibration applied to the power generating element 100 as much as possible.

Operation

The power generating element 100 according to this embodiment is an inductive coupling type power generating element that converts a change in magnetic flux to voltage using the coil 104. The electromagnetic induction causes an electromotive force V according to Eq. 1.

$$V = N \times \Delta\varphi/\Delta t \quad \text{(Eq. 1)}$$

where N is the number of turns of the coil 104, and Δφ is the amount of change in the magnetic flux in the coil 104 during time Δt. The electromotive force increases as the number of turns of the coil 104 increases. However, increasing the number of turns with the same volume needs to decrease the wire diameter of the coil 104, which results in an increase in the resistance of the coil 104. This decreases the electric power that can be actually used in the circuit and so on. In other words, to increase the electric power that can be actually used in the circuit and so on, it is important to have a configuration in which the volume of the coil can be increased.

The power generating element 100 of this embodiment causes the change Δφ in magnetic flux using an inverse magnetostrictive phenomenon. The inverse magnetostrictive phenomenon is a phenomenon in which magnetic permeability changes according to the stress applied. For example, when a compressive stress is applied to the magnetostrictive portion 102, the magnetic permeability decreases, and when a tensile stress is applied, the magnetic permeability increases. The level of the magnetic permeability depends on the level of the magnetoresistance of the magnetic circuit. As a result, application of stress to the magnetostrictive portion 102 causes a change in the magnetic flux in the magnetostrictive portion 102. Accordingly, applying a stress that changes with time to the magnetostrictive portion 102 causes a temporal change of the magnetic flux to generate an electromotive force according to Eq. 1.

As a result of diligent study, the inventors have found that the configuration of the power generating element 100 including the magnetic portion 107 magnetically connected in parallel to the magnetostrictive portion 102 and the interval 108 connected in series to the magnetic portion 107 provides a large electromotive force.

Figure 2A:
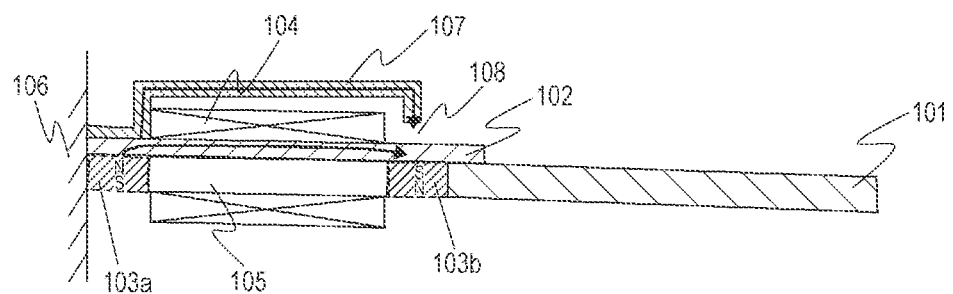
FIG. 2A is a schematic cross-sectional view of the power generating element of the first embodiment illustrating an example of the principle thereof.
Figure 2B:
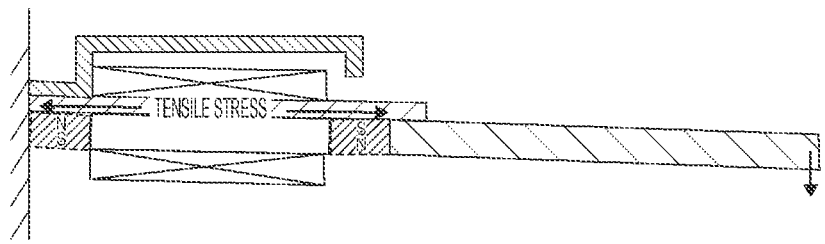
FIG. 2B is a schematic cross-sectional view of the power generating element of the first embodiment illustrating an example of the principle thereof.
Figure 3:
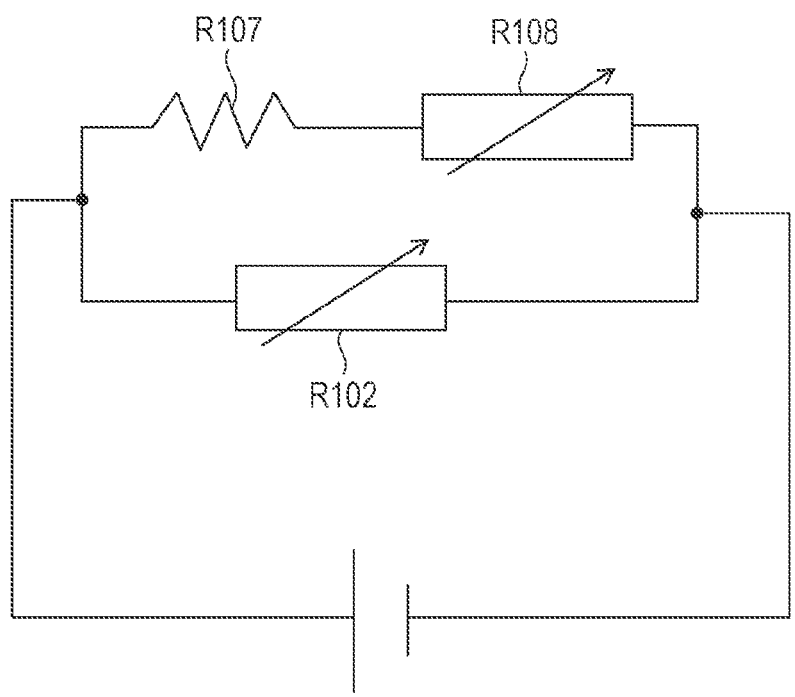
FIG. 3 is a schematic diagram illustrating an example of the equivalent magnetic circuit of the power generating element of the first embodiment.

Referring to FIGS. 2A and 2B and FIG. 3, the principle in which the power generating element 100 of this embodiment provides a large electromotive force will be described hereinbelow.

FIGS. 2A and 2B are schematic cross-sectional views of the power generating element 100 of this embodiment respectively illustrating an example of the directions of the external magnetic field and the stress applied for a period of time. FIG. 3 is a diagram illustrating the equivalent magnetic circuit of the power generating element 100 of this embodiment, in which reference sign R102 denotes the magnetoresistance of the magnetostrictive portion 102, R107 denotes the magnetoresistance of the magnetic portion 107, and R108 denotes the magnetoresistance of the interval 108. In other words, the magnetic portion 107 is magnetically connected in parallel with the magnetostrictive portion 102, and is fixed so as to have the interval 108, which is magnetically connected in series with the magnetic portion 107, between the magnetostrictive portion 102 and the magnetic portion 107.

Assume that a downward force is applied to the end of the holding plate 101 during time Δt, as shown in FIG. 2B.

At that time, a tensile stress is applied to the magnetostrictive portion 102, which increases the magnetic permeability of the magnetostrictive portion 102 because of the inverse magnetostrictive phenomenon. Accordingly, the magnetoresistance R102 of the magnetostrictive portion 102 decreases. In contrast, the magnetoresistance R108 increases because the interval 108 expands, as shown in FIG. 2B. Thus, the magnetoresistance of the interval 108 has a negative correlation with the magnetoresistance R102 of the magnetostrictive portion 102 (hereinafter, this is defined as "the magnetoresistance changes to the opposite phase").

Thus, providing the interval 108 so that the magnetoresistance R102 of the magnetostrictive portion 102 and the magnetoresistance R108 of the interval 108 change to opposite phases increases the change Δφ in the magnetic flux in the coil 104.

More specifically, the magnetoresistance R108 of the interval 108 increases when the magnetoresistance R102 of the magnetostrictive portion 102 decreases. For that reason, more magnetic flux will pass through the coil 104 than a case where the magnetoresistance R102 of the magnetostrictive portion 102 simply decreases, resulting in an increase in the change amount Δφ of the magnetic flux in the coil 104.

In other words, when a tensile stress is applied to the magnetostrictive portion 102, the configuration of this embodiment increases the change amount Δφ of the magnetic flux in the coil 104, thereby increasing the electromotive force V according to Eq. 1.

Next, assume that an upward force is applied to the end of the holding plate 101 during time Δt (not shown).

At that time, a compressive stress is applied to the magnetostrictive portion 102, which decreases the magnetic permeability of the magnetostrictive portion 102 because of the inverse magnetostrictive phenomenon. Accordingly, the magnetoresistance R102 of the magnetostrictive portion 102 increases. In contrast, the magnetoresistance R108 decreases because the interval 108 is narrowed, as shown in FIG. 2B.

In other words, since the decreased amount (mainly leakage flux) of the magnetic flux passing though the magnetostrictive portion 102 due to the inverse magnetostrictive phenomenon passes through the magnetoresistance R107 and the magnetoresistance R108 with lower magnetoresistance outside the coil 104, the change amount Δφ of the magnetic flux in the coil 104 increases (if the channels of R107 and R108 are not present, leakage flux is generated in the coil 104, and the sum of the magnetic flux in the coil 104 remain almost unchanged, so that the change amount Δφ of the magnetic flux decreases.

In other words, also when a compressive stress is applied to the magnetostrictive portion 102, the configuration of this embodiment increases the change amount Δφ of the magnetic flux in the coil 104, increasing the electromotive force V according to Eq. 1.

Accordingly, in power generation using a magnetostrictive material, the configuration of this embodiment increases the change amount Δφ of the magnetic flux in the coil 104, thereby increasing the power generated by the power generating element 100. Furthermore, the configuration allows the number of turns of the coil 104 to be easily increased by freely adjusting the interval between the magnetic portion 107 and the coil 104, thereby increasing the power generation amount. This configuration allows the stress applied to the magnetostrictive portion 102 to be increased and the mechanical attenuation of vibrations applied to the magnetostrictive portion 102 to decreased as compared with a case in which the opposite ends of the magnetic portion 107 are fixed to the magnetostrictive portion 102, thereby increasing the power generation amount. Furthermore, this configuration allows the natural frequency of the power generating element to be decreased as compared with the case in which the opposite ends of the magnetic portion 107 are fixed to the magnetostrictive portion 102, thereby increasing the power generation amount using low-frequency base excitation without increasing the size. Magnetically connecting the interval 108 in parallel with the magnetic portion 107 allows for effective use of the change of magnetic flux caused by the inverse magnetostrictive effect, thereby increasing the power generation amount.

Second Embodiment

In the first embodiment, the power generating element 100 includes one magnetostrictive portion and one magnetic portion. In the second embodiment, the power generating element includes two magnetostrictive portions and two magnetic portions. This configuration further increases the amount of power generated by the power generating element. The numbers of the magnetostrictive portion and the magnetic portion are not limited to two. The power generating element may include two or more magnetic portions and two or more magnetostrictive portions.

Referring to FIGS. 4A and 4B and FIGS. 5A and 5B, the configuration and the process of this embodiment will be described hereinbelow.

Figure 4A:
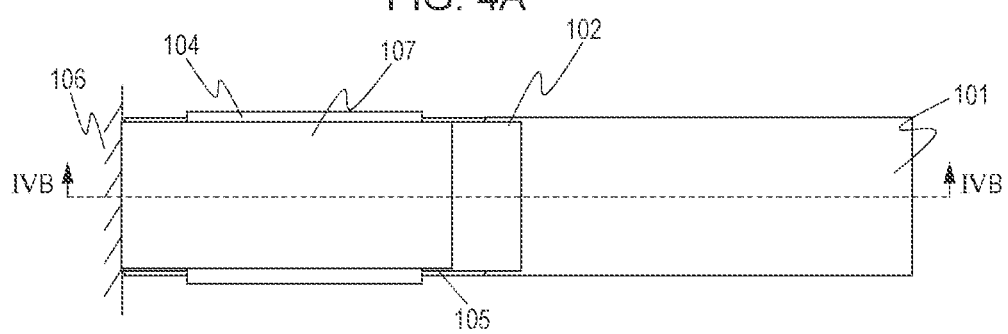
FIG. 4A is a schematic top view of a power generating element of a second embodiment illustrating an example of the configuration thereof.
Figure 4B:
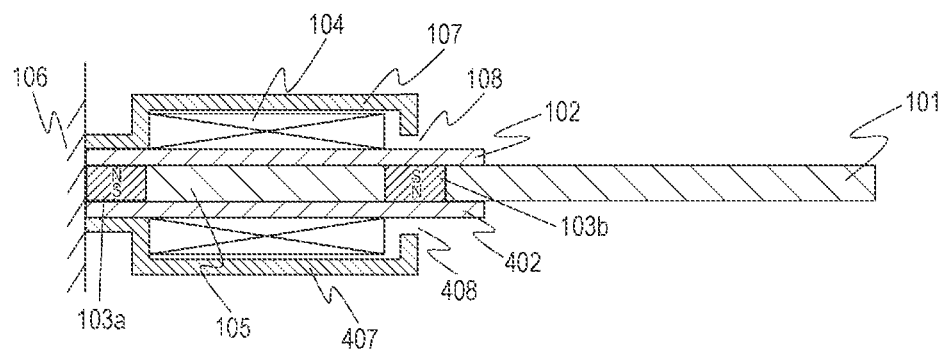
FIG. 4B is a schematic cross-sectional view of the power generating element of the second embodiment.

FIG. 4A is a schematic top view of the power generating element 100 of this embodiment illustrating the configuration thereof. FIG. 4B is a schematic cross-sectional view of the power generating element 100 of this embodiment taken along IVB-IVB in FIG. 4A. A magnetostrictive portion 402, a magnetic portion 407, and a interval 408 differ in configuration from the first embodiment but are the same in function as the magnetostrictive portion 102, the magnetic portion 107, and the interval 108, respectively. The other configurations are the same as those of the first embodiment, and descriptions thereof will be omitted.

The power generating element 100 of this embodiment is held by the holder 106 and includes both of the magnetostrictive portion 102 and the magnetostrictive portion 402.

The magnetostrictive portion 102 and the magnetostrictive portion 402 contain a magnetostrictive material. The magnetostrictive portion 102 and the magnetostrictive portion 402 may have any suitable shape that enables connection to the holding plate 101 and may be rectangular parallelepiped or columnar in shape. The magnetostrictive portion 102 and the magnetostrictive portion 402 may contain a ductile magnetostrictive material because they continuously receive a compressive stress and a tensile stress. The magnetostrictive material may be a known magnetostrictive material, such as an iron-gallium alloy, an iron-cobalt alloy, an iron-aluminum alloy, an iron-gallium-aluminum alloy, or an iron-silicon-boron alloy, but they are given for mere illustrative purposes.

The magnetic portion 107 and the magnetic portion 407 contains a magnetic material. The magnetic portion 107 and the magnetic portion 407 constituting magnetic circuits are magnetically connected in parallel to the magnetostrictive portion 102 and the magnetostrictive portion 402, respectively. The material includes a carbon steel, a ferritic stainless steel (for example, SUS430), a martensitic stainless steel (for example, SUS420J2), and any other materials. The magnetostrictive portion 102 and the magnetic portion 107, and the magnetostrictive portion 402 and the magnetic portion 407 are individually joined together. The magnetostrictive portions 102 and 402 and the magnetic portions 107 and 407 may be firmly fixed by any connecting method, for example, laser welding, adhesive joining, solder joining, ultrasonic bonding, or bolt-nut joining.

The magnetic portions 107 and 407 may be fixed to the magnetostrictive portions 102 and 402, respectively, so as to cover the coil 104 to increase the amount of change in the magnetic flux passing through the coil 104. For that reason, the magnetic portions 107 and 407 may partly have a U-like shape in cross section. In this case, the U-like shape in cross section of the magnetic portions 107 and 407 does not necessarily need to be symmetric and may be asymmetric to provide the intervals 108 and 408, as shown in FIG. 4B. The shape of the magnetostrictive portions 107 and 407 is given for mere illustrative purposes and is not intended to limit the disclosure.

As shown in FIG. 4B, the intervals 108 and 408 are spaces having low magnetic resistance between the magnetostrictive portion 102 and the magnetic portion 107 and between the magnetostrictive portion 402 and the magnetic portion 407, respectively. In the power generating element 100 according to this embodiment, the interval 108 is magnetically connected in series to the magnetic portion 107. The magnetic resistance of the interval 108 decreases when a compressive stress is applied to the magnetostrictive portion 102 and increases when a tensile stress is applied to the magnetostrictive portion 102. The interval 408 is magnetically connected in series to the magnetic portion 407. The magnetic resistance of the interval 408 decreases when a compressive stress is applied to the magnetostrictive portion 402 and increases when a tensile stress is applied to the magnetostrictive portion 402.

Operation

The power generating element 100 according to this embodiment is an inductive coupling type power generating element that converts a change in magnetic flux to voltage using the coil 104. The electromagnetic induction causes an electromotive force V according to Eq. 1.

$$V = N \times \Delta\varphi/\Delta t \quad \text{(Eq. 1)}$$

where N is the number of turns of the coil 104, and $\Delta\varphi$ is the amount of change in the magnetic flux in the coil 104 during time $\Delta t$. The power generating element 100 of this embodiment causes the change $\Delta\varphi$ in magnetic flux using the inverse magnetostrictive phenomenon. The inverse magnetostrictive phenomenon is a phenomenon in which magnetic permeability changes according to the stress applied.

Figure 5A:
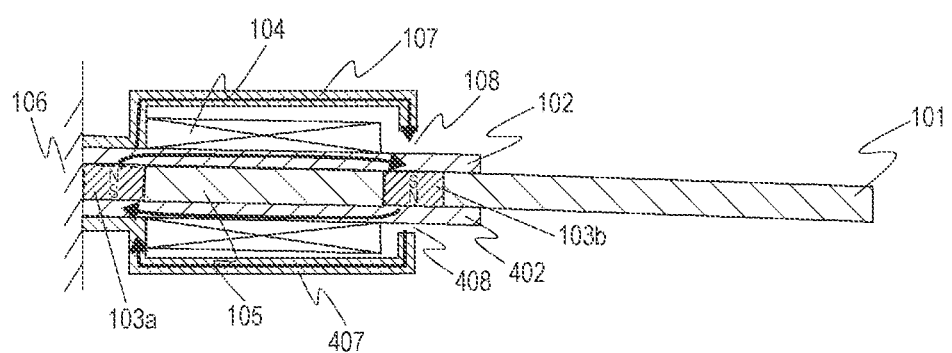
FIG. 5A is a schematic cross-sectional view of the power generating element of the second embodiment illustrating an example of the principle thereof.
Figure 5B:
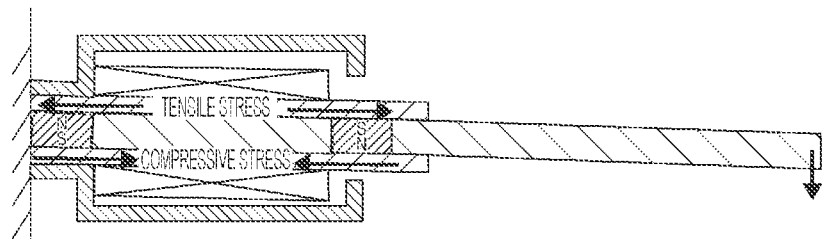
FIG. 5B is a schematic cross-sectional view of the power generating element of the second embodiment illustrating an example of the principle thereof.

FIGS. 5A and 5B are schematic cross-sectional views of the power generating element 100 of this embodiment shown in FIGS. 4A and 4B respectively illustrating an example of the directions of the external magnetic field and the stresses applied for a period of time. FIG. 5A illustrates the direction of the external magnetic field. FIG. 5B illustrates the direction of the applied stresses. Since the direction of the external magnetic field depends on the positional relationship of the magnets, the direction does not change in any power generation period. Furthermore, the positions of the magnets are adjusted in this embodiment so that the directions of the external magnetic fields applied to the magnetostrictive portion 102 and the magnetostrictive portion 402 are opposite. In contrast, the directions of the applied stresses change in one power generation period. The directions of the stresses applied to the magnetostrictive portion 102 and the magnetostrictive portion 402 are always opposite. In other words, when a tensile stress is applied to one, a compressive stress is applied to the other. Referring to FIG. 5B, assume that the magnetostrictive portion 102 receives a tensile stress, and the magnetostrictive portion 402 receives a compressive stress of the same level during time Δt. Assuming that the direction of the magnetic field on the magnetostrictive portion 102 in FIG. 5A is positive, the magnetoresistance of the magnetostrictive portion 102 is decreased by the tensile stress to cause a change +Δφ in magnetic flux. In contrast, the magnetostrictive portion 402 increases in magnetoresistance because of the compressive stress, causing a change −Δφ in magnetic flux in the direction of the magnetic field of the magnetostrictive portion 402. However, the direction of the magnetic field of the magnetostrictive portion 402 is opposite to that of the magnetostrictive portion 102, as shown in FIG. 4A. Accordingly, the magnetic flux change is expressed as −(−Δφ)=+Δφ. As a result, the directions of the changes of magnetic flux of the magnetostrictive portion 102 and the magnetostrictive portion 402 are the same, and the total change of magnetic flux of the magnetostrictive portion 102 and the magnetostrictive portion 402 is Δφ+Δφ=2Δφ. The magnetoresistances of the interval 108 and the interval 408 change to the phases opposite to the magnetoresistances of the magnetostrictive portion 102 and the magnetostrictive portion 402, respectively.

Thus, the configuration of the power generating element 100 of this embodiment allows for efficiently converting the changes in magnetic flux generated in two magnetostrictive portions using one coil.

Furthermore, this configuration allows for freely setting the space for increasing the number of turns of the coil as compared with the known inverse magnetostrictive power generating element with the bimorph structure, further increasing the amount of power generation. Furthermore, this configuration increases the stress applied to the magnetostrictive portion 102, increasing the amount of power generation, as compared with a case in which the opposite ends of the magnetic portion 107 are fixed to the magnetostrictive portion 102. Furthermore, this configuration decreases the natural frequency of the power generating element 100, increasing the amount of power generation due to low-frequency base excitation without increasing the size, as compared with the case in which the opposite ends of the magnetic portion 107 are fixed to the magnetostrictive portion 102. Furthermore, this configuration does not need to wind coils on magnetostrictive rods in advance. This reduces production problems such as coil breaks and short circuits in bonding the magnetostrictive rods by welding or the like.

EXAMPLES

The present disclosure will be described in detail hereinbelow with reference to specific examples. It is to be understood that the present disclosure is not limited to the configurations and forms of the following examples.

Example 1

Method for Producing Power Generating Element

In this example, the power generating element 100 shown in FIGS. 1A to 1C was produced. In Example 1, the nonmagnetic area 105 and the holding plate 101 are made of the same member. The individual production processes will be described with reference to FIGS. 6A to 6E. In FIGS. 6A to 6E, the upper diagrams are schematic top views, and the lower diagrams are schematic cross-sectional views taken along line A-B in the upper diagrams.

Figure 6A:
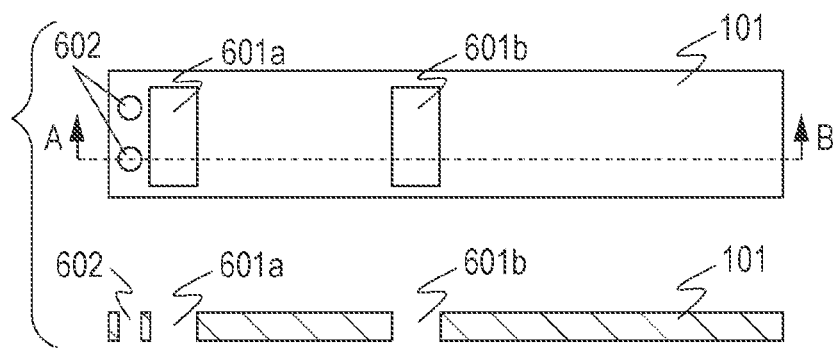
FIG. 6A is a schematic diagram illustrating an example of a method for producing a power generating element of Example 1.

First, the holding plate 101 also serving as the nonmagnetic area 105 was prepared. The holding plate 101 is made of a spring austenite stainless steel SUS304-CSP with a thickness of 1.5 mm, a width of 16 mm, and a length of 55 mm. The holding plate 101 of this embodiment serves both as a holder and a nonmagnetic portion. The holding plate 101 was provided with holes 601a and 601b for housing the magnets 103a and 103b, respectively, and holding screw holes 602 (FIG. 6A).

Figure 6B:
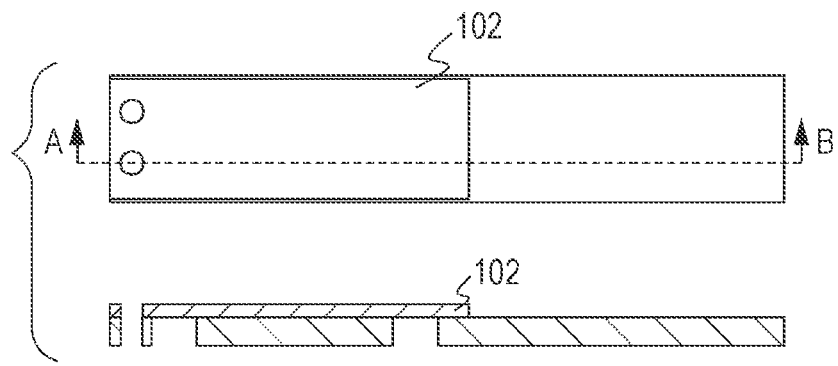
FIG. 6B is a schematic diagram illustrating an example of a method for producing the power generating element of Example 1.

Next, the magnetostrictive portion 102 made of an iron-gallium alloy with a thickness of 0.5 mm, a width of 15 mm, and a length of 25 mm was bonded to the holding plate 101 with an epoxy-based adhesive. Thereafter, the magnetostrictive portion 102 and the holding plate 101 were joined along the contact edge by laser welding (FIG. 6B).

Figure 6C:
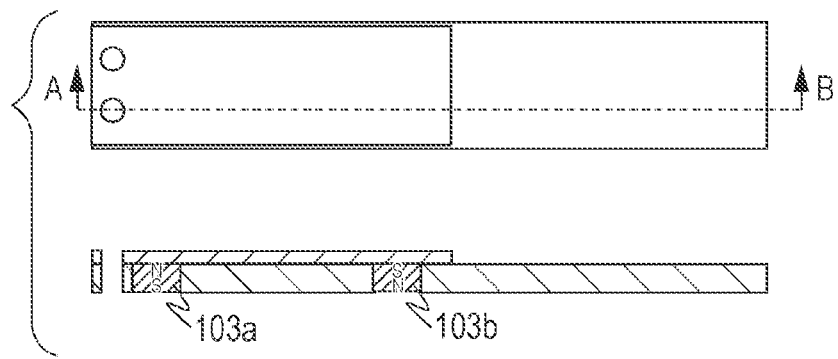
FIG. 6C is a schematic diagram illustrating an example of the method for producing the power generating element of Example 1.

The magnets 103a and 103b each made of a neodymium magnet with a thickness of 1.5 mm, a width of 12 mm, and a length 1.5 mm were prepared. The magnets 103a and 103b were inserted so that the orientations of the magnetic poles are opposite, as shown in FIG. 6C. In insertion, the magnets 103a and 103b were bonded to the magnetostrictive portion 102 with an epoxy-based adhesive (FIG. 6C).

Figure 6D:
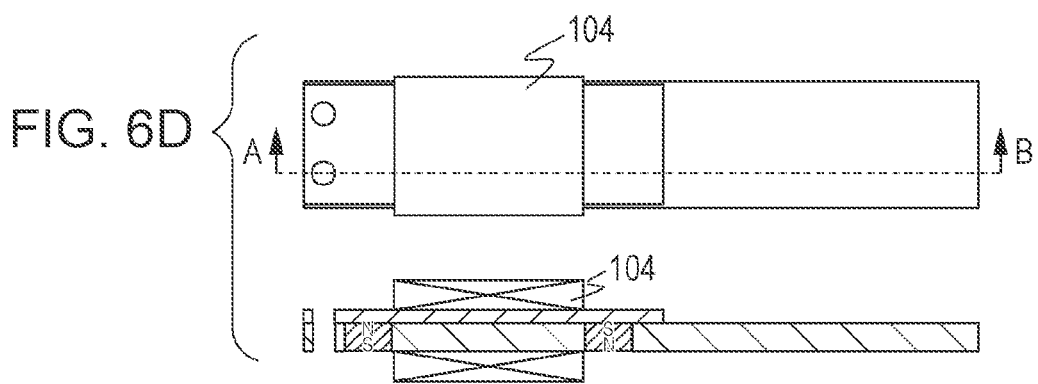
FIG. 6D is a schematic diagram illustrating an example of the method for producing the power generating element of Example 1.

Next, the coil 104 made of a 2,000-turn air-core coil made of a copper wire with a diameter of 0.2 mm was inserted into the area between the magnets 103a and 103b and was fixed with electrical insulating varnish (FIG. 6D).

Figure 6E:
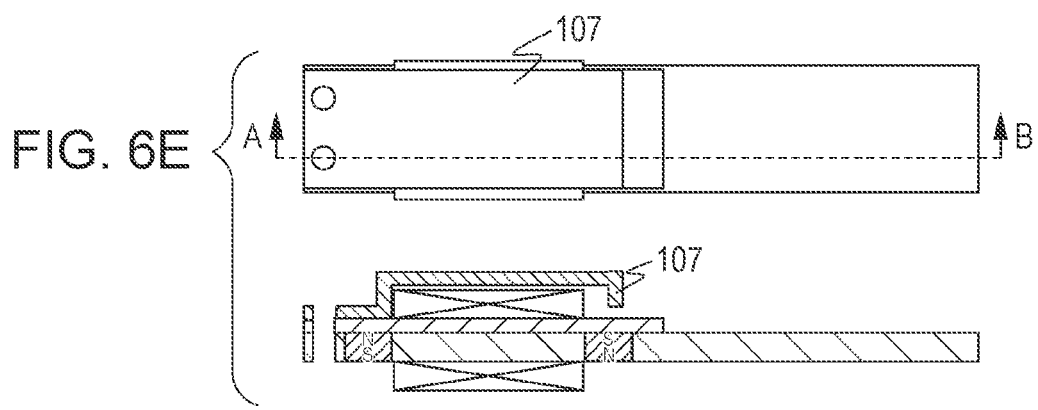
FIG. 6E is a schematic diagram illustrating an example of the method for producing the power generating element of Example 1.

Lastly, the magnetic portion 107 constituting a magnetic circuit and made of a cold rolled steel plate SPCC with a thickness of 0.5 mm, a width of 15 mm, and a length of 25 mm was fixed through the screw holes 602 (FIG. 6E).

Evaluation of Power Generating Element

The power generation performance of the power generating element 100 produced in this way was evaluated by flipping an end of the holding plate 101 and measuring the open voltage generated at the coil 104 with an oscilloscope. For the force applied in flipping, a force that saturates the electromotive force when gradually increased was used. This applied force takes various values according to the configuration of the power generating element but was employed because it may provide the greatest power generation performance of the power generating element 100. For the quantitative indicator of the power generation performance, a power generation amount P calculated from the voltage waveform measured by the oscilloscope using Eq. 2 was used.

$$P = \Sigma (V(t))2/(4 \times R) \times \Delta t \quad \text{(Eq. 2)}$$

where V(t) is an open voltage during time t measured by the oscilloscope, R is the electrical resistance of the coil 104, Δt is the time resolution of the oscilloscope, and Σ indicates summation for time t. The equation of power generation amount P excludes the effect of the inductance of the coil 104. This is because the example and the comparative examples use coils of the same dimensions, so that relative comparison can be performed. The result of the measurement and evaluation using the above method showed that the electrical resistance of the coil 104 was 46Ω, the maximum value of the open voltage was 15 V, and the power generation amount P was 2.4 mJ according to Eq. 2.

Example 2

Method for Producing Power Generating Element

In this example, the power generating element 100 shown in FIGS. 4A and 4B was produced. In Example 2, the nonmagnetic area 105 and the holding plate 101 were made of the same member. In this example, the entire ridges of the magnetostrictive portion 102 and the magnetostrictive portion 402 were supported by the holding plate 101 having a spring property. This configuration reduces mechanical attenuation, which may increase the power generation amount.

The individual production processes will be described with reference to FIGS. 7A to 7F.

In FIGS. 7A to 7F, the upper diagrams are schematic top views, and the lower diagrams are schematic cross-sectional views taken along line A-B in the upper diagrams.

Figure 7A:
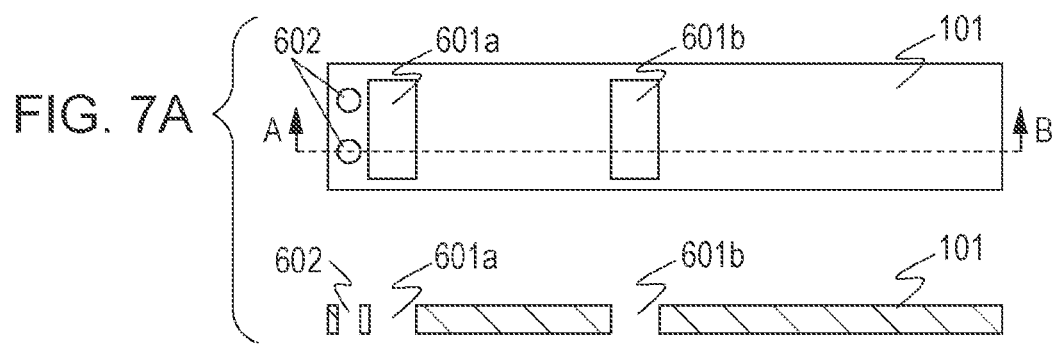
FIG. 7A is a schematic diagram illustrating an example of a method for producing a power generating element of Example 2.

First, the holding plate 101 made of a spring austenite stainless steel SUS304-CSP with a thickness of 1.5 mm, a width of 16 mm, and a length of 55 mm was prepared. The holding plate 101 of this embodiment serves both as a holder and a nonmagnetic portion. The holding plate 101 was provided with holes 601a and 601b for housing the magnets 103a and 103b, respectively, and holding screw holes 602 (FIG. 7A).

Figure 7B:
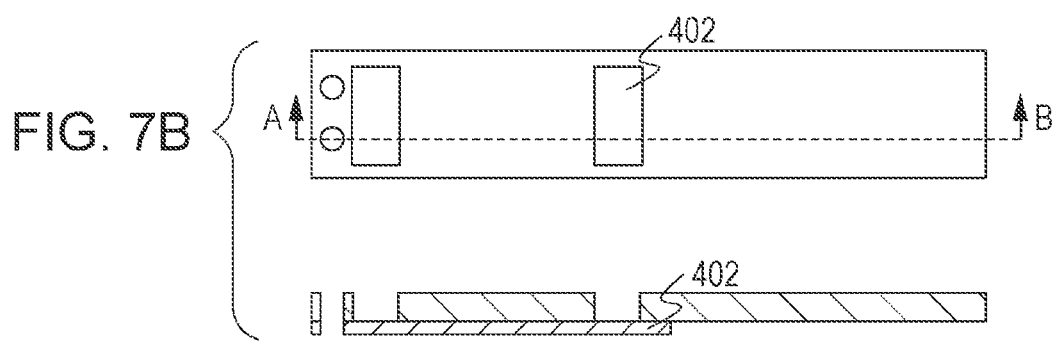
FIG. 7B is a schematic diagram illustrating an example of the method for producing the power generating element of Example 2.

Next, the magnetostrictive portion 402 made of an iron-gallium alloy with a thickness of 0.5 mm, a width of 15 mm, and a length of 25 mm was bonded to the holding plate 101 with an epoxy-based adhesive. Thereafter, the magnetostrictive portion 402 and the holding plate 101 were joined along the contact edge by laser welding (FIG. 7B).

Figure 7C:
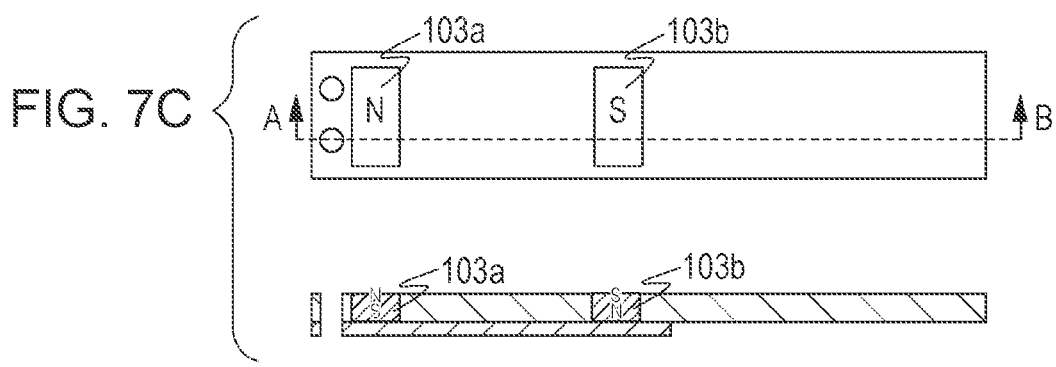
FIG. 7C is a schematic diagram illustrating an example of the method for producing the power generating element of Example 2.

The magnets 103a and 103b each made of a neodymium magnet with a thickness of 1.5 mm, a width of 12 mm, and a length 1.5 mm were prepared. The magnets 103a and 103b were inserted so that the orientations of the magnetic poles are opposite, as shown in FIG. 7C. In insertion, the magnets 103a and 103b were bonded to the magnetostrictive portion 402 with an epoxy-based adhesive (FIG. 7C).

Figure 7D:
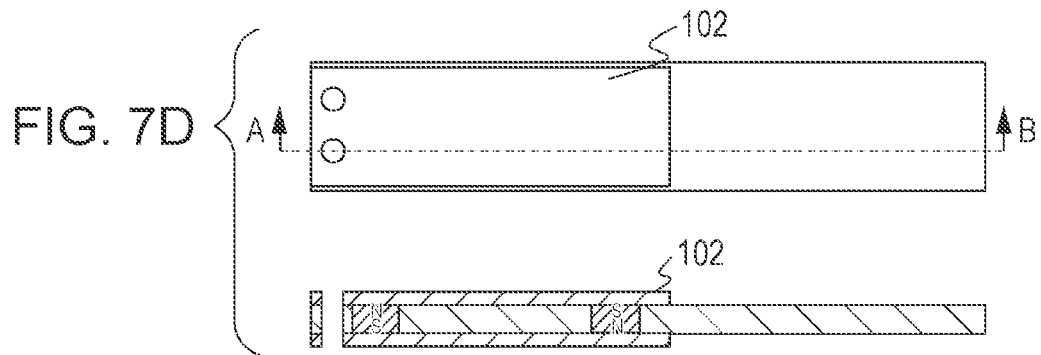
FIG. 7D is a schematic diagram illustrating an example of the method for producing the power generating element of Example 2.

Next, the magnetostrictive portion 102 made of an iron-gallium alloy with a thickness of 0.5 mm, a width of 15 mm, and a length of 25 mm was bonded to the holding plate 101 and the magnets 103a and 103b with an epoxy-based adhesive. Thereafter, the magnetostrictive portion 102 and the holding plate 101 were joined along the contact edge by laser welding (FIG. 7D).

Figure 7E:
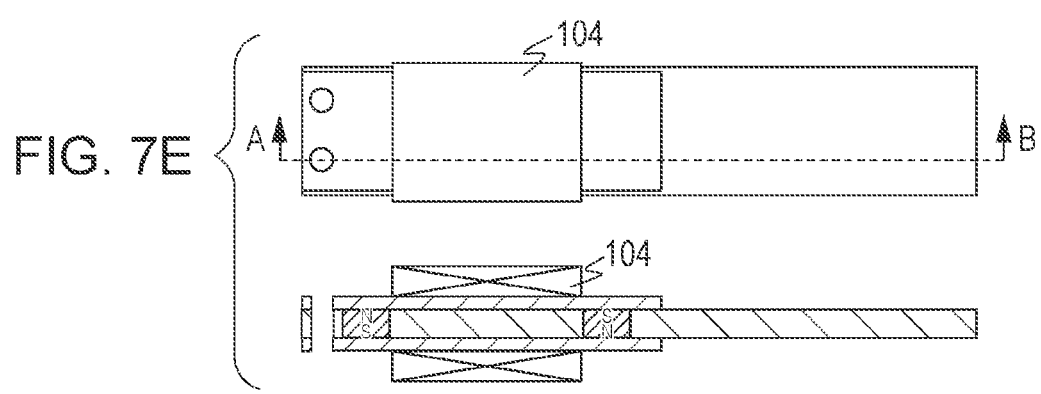
FIG. 7E is a schematic diagram illustrating an example of the method for producing the power generating element of Example 2.

Next, the coil 104 made of a 2,000-turn air-core coil made of a copper wire with a diameter of 0.2 mm was inserted into the area between the magnets 103a and 103b and was fixed with electrical insulating varnish (FIG. 7E).

Figure 7F:
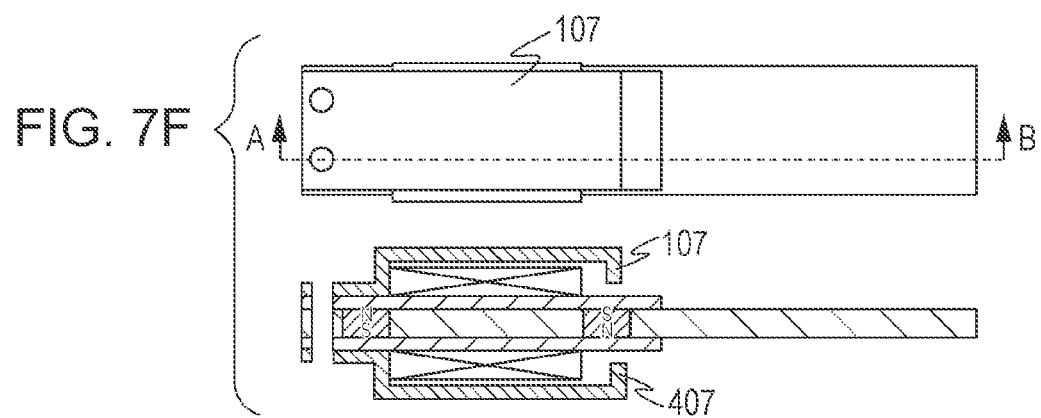
FIG. 7F is a schematic diagram illustrating an example of the method for producing the power generating element of Example 2.

Lastly, the magnetic portions 107 and 407 each constituting a magnetic circuit and made of a cold rolled steel plate SPCC with a thickness of 0.5 mm, a width of 15 mm, and a length of 25 mm were fixed through the screw holes 602 (FIG. 7F).

Evaluation of Power Generating Element

The power generation performance of the power generating element 100 produced in this way was evaluated as in Example 1. An example of the voltage waveform measured with an oscilloscope is shown in FIG. 8. The evaluation result showed that the electrical resistance of the coil 104 was 46Ω, the maximum value of the open voltage was 30 V, and the power generation amount P was 9.6 mJ.

Comparative Example 1

Method for Producing Power Generating Element

Figure 9A:
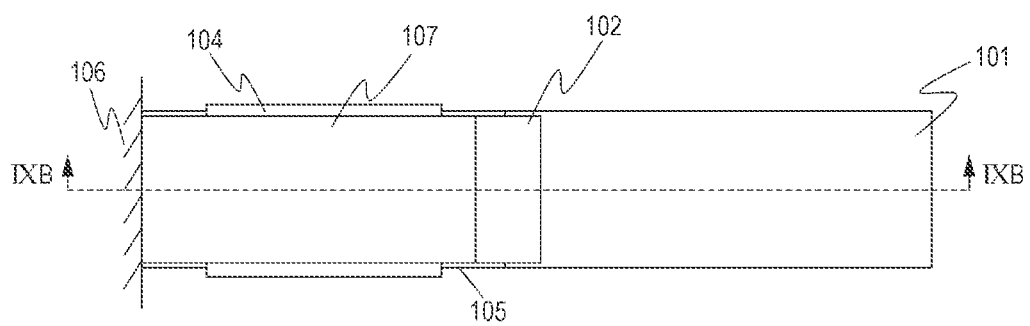
FIG. 9A is a schematic top view of a power generating element of Comparative Example 1 illustrating an example of the configuration thereof.
Figure 9B:
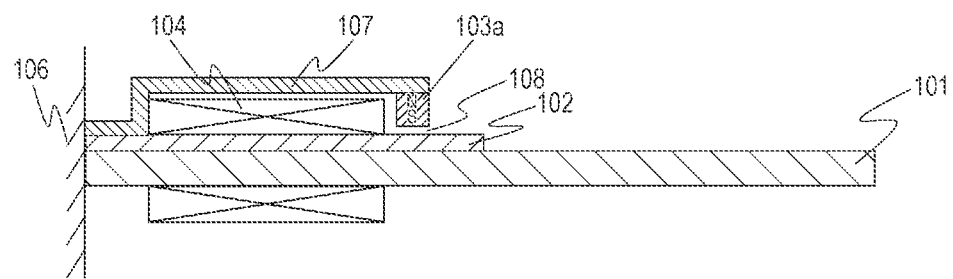
FIG. 9B is a schematic cross-sectional view of the power generating element of Comparative Example 1 illustrating an example of the configuration thereof.
Figure 10:
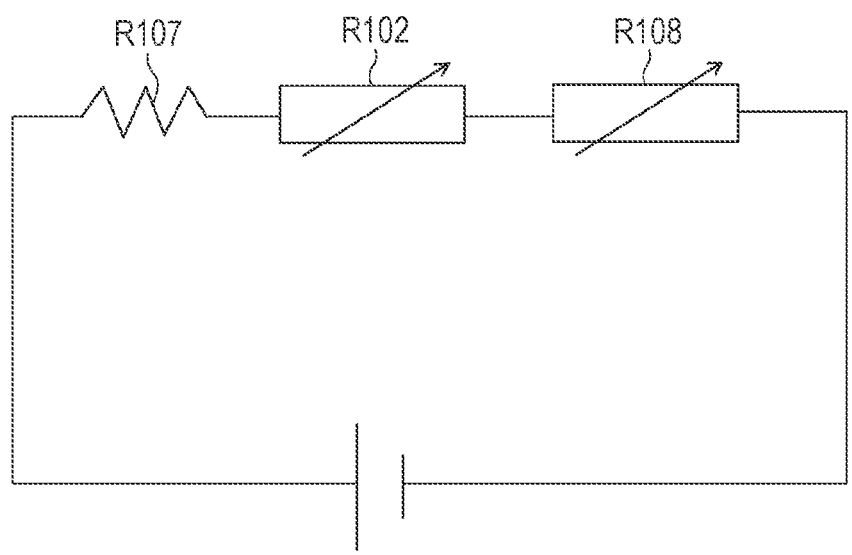
FIG. 10 is a schematic diagram illustrating an example of the equivalent magnetic circuit of Comparative Example 1.

In this comparative example, the power generating element shown in FIGS. 9A and 9B was produced. The method of production is substantially the same as in FIGS. 6A to 6E but differs in that the magnet holes 601a and 602b in the holding plate 101 shown in FIG. 6A are not provided and that the process of inserting the magnets 103a and 103b shown in FIG. 6C is not needed, and instead, the method includes a process for bonding the magnet 103a (a neodymium magnet with a thickness of 3.0 mm, a width of 12 mm, and a length of 1.5 mm) to an end of the magnetic portion 107 with an epoxy resin in the process of forming the magnetic portion 107 constituting a magnetic circuit in FIG. 7F. The equivalent magnetic circuit of Comparative Example 1 is shown in FIG. 10. Thus, the magnetoresistances in Comparative Example 1 are connected in series.

Evaluation of Power Generating Element

The power generation performance of the power generating element produced in this way was evaluated as in Example 1. The evaluation result showed that the maximum value of the open voltage was 12 V, and the power generation amount P was 1.6 mJ.

Comparative Example 2

Method for Producing Power Generating Element

Figure 11A:
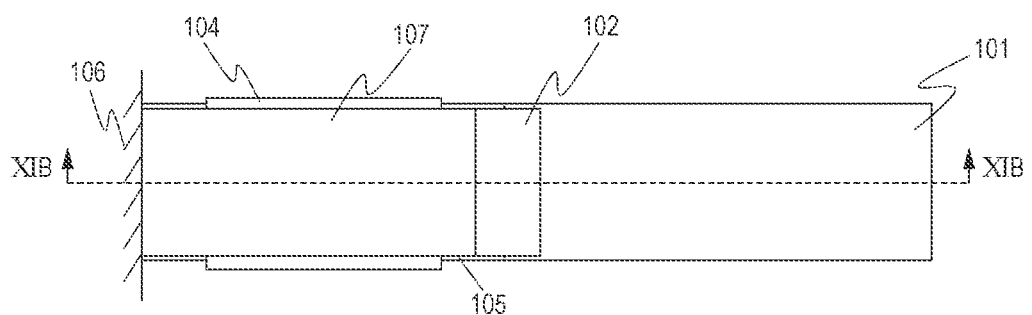
FIG. 11A is a schematic top view of a power generating element of Comparative Example 2 illustrating an example of the configuration thereof.
Figure 11B:
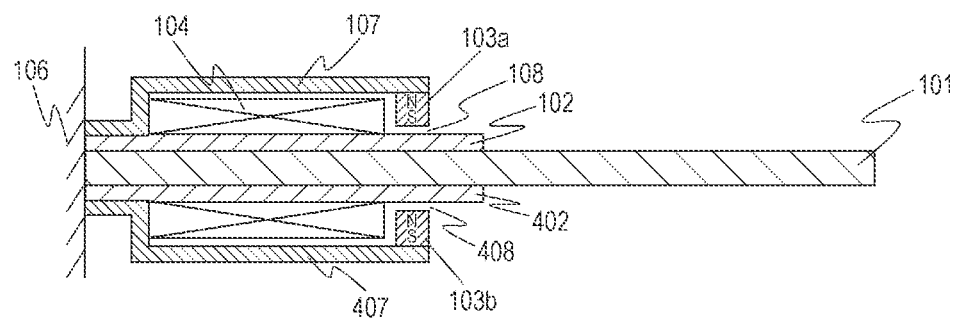
FIG. 11B is a schematic cross-sectional view of the power generating element of Comparative Example 2 illustrating an example of the configuration thereof.

In this comparative example, the power generating element shown in FIGS. 11A and 11B was produced. The method of production is similar to that of Comparative Example 1 but differs in including two magnetostrictive materials, two the magnets, and two magnetic portions constituting a magnetic circuits.

Evaluation of Power Generating Element

The power generation performance of the power generating element produced in this way was evaluated as in Example 1. The evaluation result showed that the maximum value of the open voltage was 3 V, and the power generation amount P was 0.1 mJ.

Comparative Example 3

Method for Producing Power Generating Element

Figure 12A:
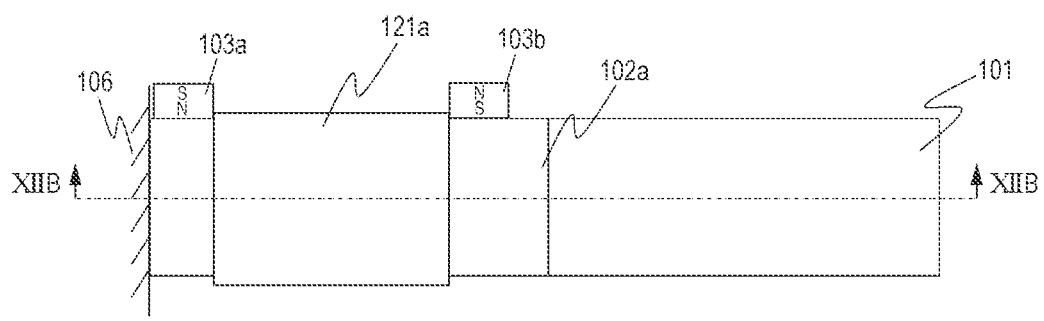
FIG. 12A is a schematic top view of a power generating element of Comparative Example 3 illustrating an example of the configuration thereof.
Figure 12B:
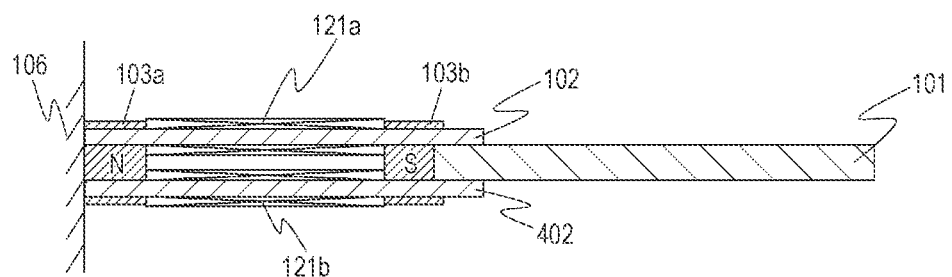
FIG. 12B is a schematic cross-sectional view of the power generating element of Comparative Example 3 illustrating an example of the configuration thereof.

In this comparative example, the power generating element shown in FIGS. 12A and 12B was produced. The production process is as follows. A magnetostrictive portion 102 on which a coil 121a is wound and a magnetostrictive portion 402 on which a coil 121b (with a thickness of 0.5 mm, a width of 15 mm, and a length of 25 mm) is wound were prepared. The prepared magnetostrictive portions 102 and 402 were bonded to a holding plate 101 made of SUS304-CSP (with a thickness of 1.5 mm, a width of 15 mm, and a length of 35 mm) with an epoxy-based resin and were then subjected to laser welding while paying attention not to cause coil breaks. The magnets 103a and 103b were arranged as shown in FIGS. 12A and 12B. This arrangement allows magnetic fields in the same direction to be applied to the magnetostrictive portions 102 and 402. The coils 121a and 121b were wound on the magnetostrictive portions 102 and 402, respectively. For this reason, with the coils 121a and 121b made of a 0.2 mm copper wire, only 180 turns could be wound.

Evaluation of Power Generating Element

The power generation performance of the power generating element produced in this way was evaluated as in Example 1. The evaluation result showed that the maximum value of the open voltage was 2 V, and the power generation amount P was 0.1 mJ.

The results show that the present disclosure allows generating more electric power than the exiting power generating elements using the inverse magnetostrictive phenomenon shown in Comparative Examples 1 to 3.

The use of the power generating elements in the embodiments and examples allows generating more electric power than the existing magnetostrictive power generating apparatuses, allowing size reduction of power generating apparatuses. This is therefore particularly advantageous as power generating apparatuses for devices of a size that has been difficult to install. For example, the power generating apparatuses can be used for mobile phones. Furthermore, the power generating apparatuses can also be used as power sources for various devices including IoT devices by being installed in the casings of industrial equipment, business machines, medical instruments, automobiles, railroad vehicles, aircrafts, heavy equipment, or ships and vessels. The present disclosure improves the performance of power generating apparatuses and can be applied to a wide range of fields other than those described above.

The present disclosure provides a power generating element that increases the amount of power generation in power generation using a magnetostrictive material, as well as an apparatus including the power generating element.

While the present invention has been described with reference to exemplary embodiments, it is to be understood that the invention is not limited to the disclosed exemplary embodiments. Th scope of the following claims is to be accorded the broadest interpretation so as to encompass all such modifications and equivalent structures and functions. For example, the numerical values and components described in the above embodiments are given for illustrative purposes only. Different numerical values and components may be used as necessary. For example, the number of turns of the coil is 2,000 in the embodiments but may be greater than that because there is no limitation other than the installation space. In this case, the difference in power generation amount from Comparative Example 3 increases still further.

The invention claimed is:

1. A power generating element comprising:
   at least one magnetostrictive portion containing a magnetostrictive material;
   at least one magnetic portion containing a magnetic material, part of a surface of the magnetic portion being fixed to the magnetostrictive portion;
   a coil housing part of one of the magnetostrictive portion and the magnetic portion; and
   a magnet portion including a magnet and fixed to the magnetostrictive portion,
   wherein the magnetic portion is magnetically connected in parallel to the magnetostrictive portion and is fixed to the magnetostrictive portion so as to have an interval between the magnetostrictive portion and the magnetic portion, the interval being magnetically connected in series to the magnetic portion.

2. The power generating element according to claim 1, wherein at least part of the magnetic portion has a U-like shape in cross section, the magnetic portion being fixed to the magnetostrictive portion so as to cover the coil.

3. The power generating element according to claim 1, wherein the magnetic portion includes at least one of a carbon steel, a ferritic stainless steel, and a martensitic stainless steel.

4. The power generating element according to claim 1, wherein the coil is disposed between magnetic pole faces at which the magnetostrictive portion and the magnet portion connect.

5. The power generating element according to claim 1, wherein the magnet portion includes a first magnet and a second magnet, the first magnet and the second magnet being fixed to the magnetostrictive portion at different magnetic pole faces, the first magnet and the second magnet being fixed to a surface of the magnetostrictive portion, the surface being different from the surface where the magnetic portion and the magnetostrictive portion are connected.

6. The power generating element according to claim 1, wherein the magnet portion contains a magnetic material, the magnetic material of the magnet portion being physically fixed to the magnet.

7. The power generating element according to claim 1, wherein the magnetostrictive portion contains at least one of an iron-gallium alloy, an iron-cobalt alloy, an iron-aluminum alloy, an iron-gallium-aluminum alloy, and an iron-silicon-boron alloy.

8. The power generating element according to claim 1, wherein a magnetic resistance of the interval decreases when a compressive stress is applied to the magnetostrictive portion and increases when a tensile stress is applied to the magnetostrictive portion.

9. The power generating element according to claim 1, further comprising:
   a holding plate that vibrates when receiving an external force,
   wherein one end of the holding plate is fixed to the magnetostrictive portion.

10. The power generating element according to claim 9, wherein the holding plate is a nonmagnetic material.

11. The power generating element according to claim 9, wherein the holding plate is an elastic member.

12. The power generating element according to claim 1,
    wherein the at least one magnetostrictive portion comprises at least two magnetostrictive portions,
    wherein the at least one magnetic portion comprises at least two magnetic portions, and
    the coil houses the at least two magnetostrictive portions.

13. The power generating element according to claim 1, wherein a magnetoresistance of the interval has a negative correlation with magnetoresistance of the magnetostrictive portion.

14. A power generating apparatus comprising:
    the power generating element according to claim 1; and
    a mechanism for applying a force to the power generating element.

15. A power generating apparatus comprising:
    the power generating element according to claim 1; and
    a mechanism for vibrating the power generating element due to base excitation.

16. A power generating element comprising:
    a magnetostrictive portion containing a magnetostrictive material;
    a magnetic portion having a U-like shape in cross section and containing a magnetic material, the magnetic portion being fixed to the magnetostrictive portion at a first end;
    a first magnet and a second magnet fixed to a surface of the magnetostrictive portion at different magnetic pole faces, the surface being opposite to a surface where the magnetic portion is connected; and
    a coil disposed between the first magnet and the second magnet so as to house part of the magnetostrictive portion,
    wherein the magnetic portion is disposed so as to cover the coil and has an interval between the magnetostrictive portion and a second end of the magnetic portion different from the first end, the interval being magnetically connected in series to the magnetic portion.

17. A power generating element comprising:
    a magnetic portion containing a magnetic material;
    a magnetostrictive portion containing a magnetostrictive material; and a magnet,
wherein the magnetic portion and the magnetostrictive portion are magnetically connected in parallel, and
wherein the magnetic portion, the magnetostrictive material, and the magnet are arranged so as to have an interval between the magnetostrictive portion and the magnetic portion, the interval being magnetically connected in series to the magnetic portion.

* * * * *